United States Patent [19]

Lee

[11] Patent Number: 5,654,218

[45] Date of Patent: Aug. 5, 1997

[54] METHOD OF MANUFACTURING INVERSE T-SHAPED TRANSISTOR

[75] Inventor: Bong Jae Lee, Chungcheongbuk-do, Rep. of Korea

[73] Assignee: LG Semicon Co., Ltd., Chungcheongbuk-do, Rep. of Korea

[21] Appl. No.: 507,049

[22] Filed: Jul. 25, 1995

[30] Foreign Application Priority Data

May 12, 1995 [KR] Rep. of Korea ................ 11772/1995

[51] Int. Cl.$^6$ ............................................. H01L 21/265
[52] U.S. Cl. ........................................ 437/301; 438/303
[58] Field of Search ........................... 437/29, 44, 40 GS, 437/41 GS, 36, 80, 41 RLD; 257/344

[56] References Cited

U.S. PATENT DOCUMENTS

| | | | |
|---|---|---|---|
| 4,561,169 | 12/1985 | Miyazaki et al. | 437/29 |
| 4,907,048 | 3/1990 | Huang | 357/23.9 |
| 4,963,054 | 10/1990 | Hayashi | 404/34 |
| 5,120,668 | 6/1992 | Hsu et al. | 437/44 |
| 5,182,619 | 1/1993 | Pfiester | 437/44 |
| 5,432,104 | 7/1995 | Sato | 437/31 |
| 5,545,575 | 8/1996 | Cheng et al. | 437/44 |

*Primary Examiner*—John Niebling
*Assistant Examiner*—Brian K. Dutton

[57] ABSTRACT

A method of manufacturing an inverse-T shaped transistor is disclosed including the steps of sequentially forming a first insulating film and a second insulating film on a semiconductor substrate of a first conductivity type, sequentially removing a portion of the second insulating film and a portion of the first insulating film, to thereby form an inverse-T shaped void region therein, filling the inverse-T shaped void region with a conductor to form a gate electrode having a central body portion and wings, removing the remaining first and second insulating films, and implanting impurity ions of a second conductivity type, to thereby form low concentration impurity regions in substrate areas below both wings of the gate electrode and, simultaneously, to form high concentration impurity regions in substrate areas not covered by the gate electrode.

17 Claims, 5 Drawing Sheets

5,654,218

METHOD OF MANUFACTURING INVERSE T-SHAPED TRANSISTOR

BACKGROUND OF THE INVENTION

The present invention relates to a method of manufacturing a transistor, and more particularly, to an improved method of manufacturing an inverse-T shaped transistor.

FIG. 1 shows the structure of a common conventional metal oxide semiconductor field effect transistor (MOSFET).

Referring to FIG. 1, the above MOSFET is composed of a gate insulating film 2 such as a silicon oxide film formed on a p-type silicon substrate 1, a gate electrode 3 (e.g., an impurity-doped polysilicon) formed on gate insulating film 2, a gate cap oxide film 4 (e.g., a silicon oxide film) formed on gate electrode 3, an $n^+$ type source region 5 formed on the left side of gate electrode 3 in p-type silicon substrate 1, and an $n^+$ type drain region 6 formed on the right side of gate electrode 3 in p-type silicon substrate 1.

In FIG. 1, if a gate voltage $V_G$ is applied to gate electrode 3, electrons move from source region 5 to drain region 6.

However, at this time, as shown in FIG. 1, since p-type silicon substrate 1 has a high potential and $n^+$ type drain region 6 has a very low potential, a strong electric field is formed at the point "a". Therefore, electrons surge toward the point "a", so that gate oxide film 2 is liable to crack. The electrons trapped in gate electrode 3 are combined with holes there, causing the gate voltage $V_G$ to be lowered.

Accordingly, since the fixed gate voltage $V_G$ is not precisely applied, the characteristics of the MOSFET are deteriorated.

The phenomenon that electrons surge in the point "a" as described above is called the hot carrier effect.

As is well known, in order to reduce the hot carrier effect, that is, to relieve the drastic variation of the potential near the point "a" in $n^+$ type drain region 6, there has been suggested using a lightly doped drain (LDD) MOSFET comprising source and drain regions of LDD structure.

In the LDD MOSFET, the drain region, which includes only a high concentration n-type ($n^+$) region in the conventional MOSFET, is divided into a low concentration n-type ($n^-$) region and a high concentration n-type ($n^+$) region.

Therefore, a gentle variation of the potential can be obtained at the interface between the p-type substrate and n-type drain region.

In other words, it is possible to prevent a strong electric field from being formed at the above interface.

Hereinafter, a method of manufacturing a conventional LDD MOSFET will be described with reference to FIGS. 2a to 2d.

As shown in FIG. 2a, a silicon oxide film 12 for use as a gate insulating film is formed on a p-type silicon substrate 11 according to a thermal oxidation method. A polysilicon film 13 (doped with impurity) for use as a gate electrode is deposited on silicon oxide film 12 according to a chemical vapor deposition (CVD) method.

Thereafter, a silicon oxide film 14 for use as a gate cap insulating film is deposited on polysilicon film 13 using a CVD method.

A photo-lithography process is performed on silicon oxide film 14, thereby defining a gate electrode region. Silicon oxide film 14, polysilicon film 13 and silicon oxide film 12 are dry-etched simultaneously, thereby forming gate insulating film 12a, gate electrode 13a and gate cap insulating film 14a, as shown in FIG. 2b.

Then, using gate cap insulating film 14a as an ion-implantation mask, impurity ions of low concentration n-type ($n^-$ type) are implanted in a direction perpendicular to the substrate surface. As a result, $n^-$ type source region 15a and $n^-$ type drain region 15b are formed on opposite sides of gate electrode 13a in p-type silicon substrate 11.

Thereafter, as shown in FIG. 2c, a silicon oxide film for use as a gate sidewall spacer is deposited through a CVD method. A reactive ion etching (RIE) process is performed on the silicon oxide film, thereby forming sidewall spacers 16a and 16b on opposite sidewalls of gate insulating film 12a, gate electrode 13a and gate cap insulating film 14a.

Then, using gate cap insulating film 14a and sidewall spacers 16a and 16b as ion-implantation masks, impurity ions of high concentration n-type ($n^+$ type) are implanted in the direction perpendicular to the substrate surface. As a result, $n^+$ type source region 17a and $n^+$ drain region 17b are formed on both sides of sidewall spacers 16a and 16b in p-type silicon substrate 11.

As shown in FIG. 2d, after depositing an insulating film 18 through a CVD method, a photo-lithography process and a dry-etching process are performed, thereby forming a source contact hole, a gate contact hole and a drain electrode contact hole at $n^+$ source region 17a, gate electrode 13a and $n^+$ drain region 17b, respectively.

Thereafter, a metal film is deposited through a CVD method so as to completely fill the above contact holes. A photo-lithography process and a dry-etching process are then performed on the metal film, thereby forming source contact electrode 19a, gate contact electrode 19b and drain contact electrode 19c.

However, the following problems remain in the MOSFET having the above LDD structure.

First, due to the additional formation of the $n^-$ type drain region, even if the electric field is reduced at the interface between the drain region 17b and the gate insulating film 12a, gate voltage $V_g$ is not applied to the bottom of the sidewall spacer since no gate electrode is formed there.

Accordingly, a strong electric field is still formed in the interface between the drain region and the gate insulating film, and results in generation of the hot carrier effect.

Second, since the source region and drain region have an LDD structure, that is, they are formed with a double-structure of a low concentration region and a high concentration region, the source and drain regions have high resistance. Therefore, current flow is reduced as a result of the high resistance.

Third, in order to form the source and drain regions with an LDD structure, a masking process and an ion-implantation process are required to be formed twice. Therefore, the process is complicated.

In order to solve the above described first problem of the LDD MOSFET, there was suggested an inverse-T shaped MOSFET structure.

A prior art method of manufacturing the inverse-T shaped MOSFET will be described with reference to FIGS. 3a to 3f.

This method of manufacturing the inverse-T shaped MOSFET is disclosed in U.S. Pat. Nos. 4,907,048 and 4,963,054.

As shown in FIG. 3a, an oxide film 22 is grown on a p-type silicon substrate 21 as a thin gate insulating film. A polysilicon layer 23 and an oxide film 24 are deposited sequentially on gate oxide film 22, and then a photoresist is coated on oxide film 24. A photolithography process is performed on photoresist 25, thereby forming a photoresist pattern 25 for defining a gate region.

As shown in FIG. 3b, using the photoresist pattern 25 as an etch-mask, oxide film 24 is etched, and successively, polysilicon film 23 is etched to a predetermined depth from the surface thereof. Then, photoresist pattern 25 is removed. As a result, polysilicon pattern 23a and gate cap oxide film 24a are formed.

As shown in FIG. 3c, n-type impurity ions are implanted at a low concentration, thereby forming n⁻ type source region 26 and n⁻ type drain region 27.

As shown in FIG. 3d, according to a CVD method, an oxide film is deposited on the entire exposed surface of the exposed resultant structure and the oxide film is etched through an RIE method, thereby forming sidewall spacers 28a and 28b on opposite sides of polysilicon pattern 23a.

As shown in FIG. 3e, using gate cap insulating film 24a and sidewall spacers 28a and 28b as etch-masks, the exposed portion of polysilicon pattern 23a is etched, thereby forming an inverse-T shaped gate electrode 23b.

As shown in FIG. 3f, using gate cap insulating film 24a and sidewall spacers 28a and 28b as ion-implantation masks, n-type impurity ions are implanted at a high concentration, thereby forming an n⁺ type source region 29 and an n⁺ type drain region 30 in n⁻ type source region 26 and n⁻ type drain region 27, respectively.

That is, with regard to the feature of using sidewall spacers, the above described method is the same as that of the LDD MOSFET structure of FIG. 2. However, the above described method is different from that of the LDD MOSFET of FIG. 2 because the gate electrode extends to the bottom of the sidewall spacer.

In the inverse-T shaped LDD MOSFET manufactured as described above, n⁻ type source region 26 and n⁻ type drain region 27 are fully overlapped with gate electrode 23b so that they are affected by the gate voltage $V_G$. Therefore, immunity against the hot carrier effect can be improved.

However, as known in the above-described manufacturing method, in order to form the inverse-T shaped gate electrode after forming the polysilicon layer, when the polysilicon layer is etched to a predetermined depth, it is difficult to precisely control the etch-stop endpoint for stopping the etching process.

Further, in order to make the inverse-T shaped gate electrode, an additional etching process using the sidewall spacer as an etch-mask is required. Therefore, the process is complicated.

SUMMARY OF THE INVENTION

In order to solve the above described problems, it is an object of the present invention to provide an improved method of manufacturing an inverse-T shaped transistor, wherein the manufacturing process can be simplified.

To accomplish the above object, there is provided a method of manufacturing an inverse-T shaped transistor comprising the steps of forming a first insulating film on a substrate having ions of a first conductivity type, forming a second insulating film on said first insulating film, forming an inverse-T shaped void region by etching said first and second insulating films, forming a gate electrode having wings wider than a main body part by filling said T-shaped void region with a conductor, removing said first and second insulating films, forming low concentration impurity regions in said substrate below the wings of said gate electrode, and forming high concentration impurity regions in substrate areas not covered by said gate electrode by implanting impurity ions of a second conductivity type.

DETAILED DESCRIPTION OF THE INVENTION

Hereinafter, the present invention will be described in more detail with reference to FIGS. 4a to 4h.

Figure 1:
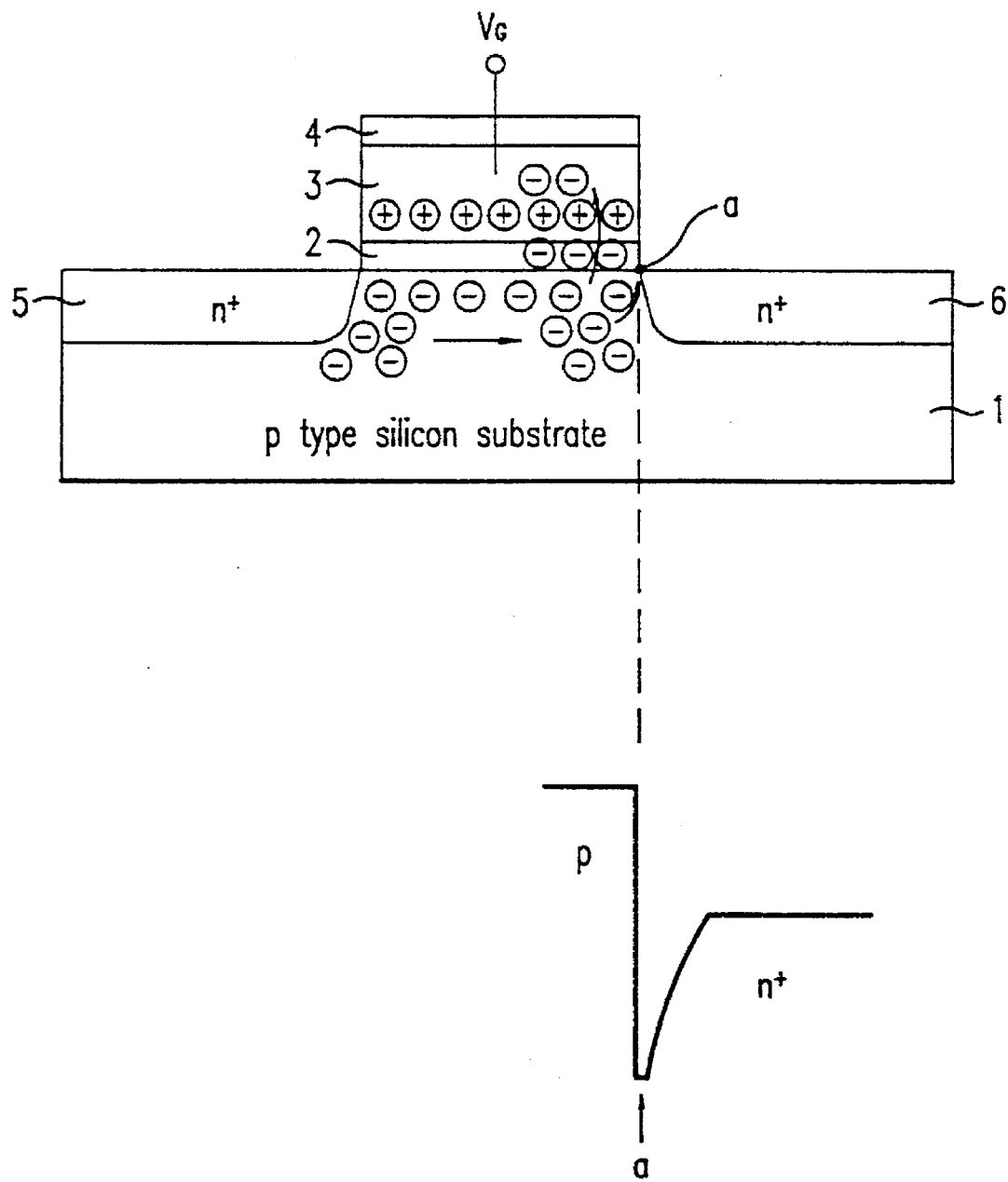
FIG. 1 is a cross-sectional view showing the structure of a commonly-used LDD MOSFET.
Figure 2A:
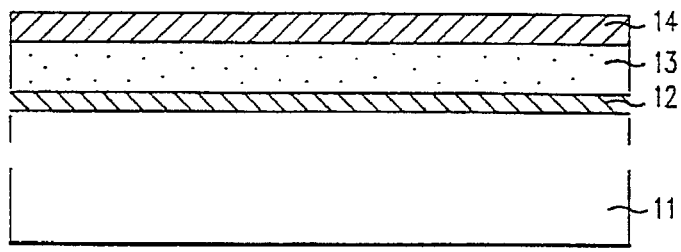
FIGS. 2a to 2d are cross-sectional views for illustrating a method of manufacturing the conventional LDD MOSFET.
Figure 2B:
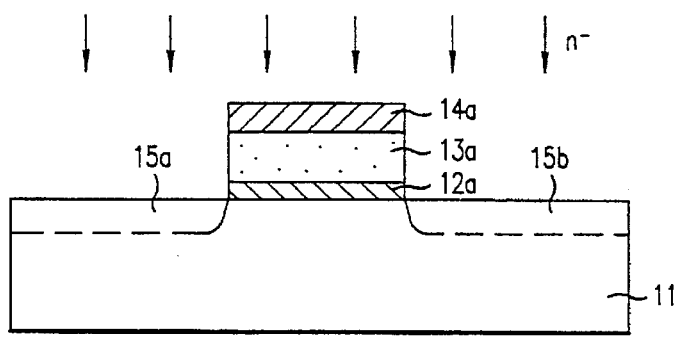
Figure 2C:
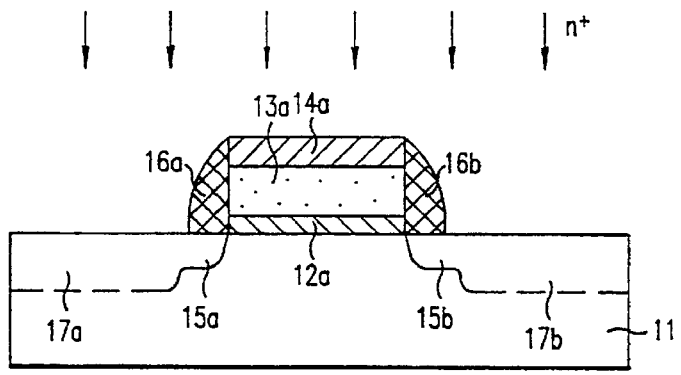
Figure 2D:
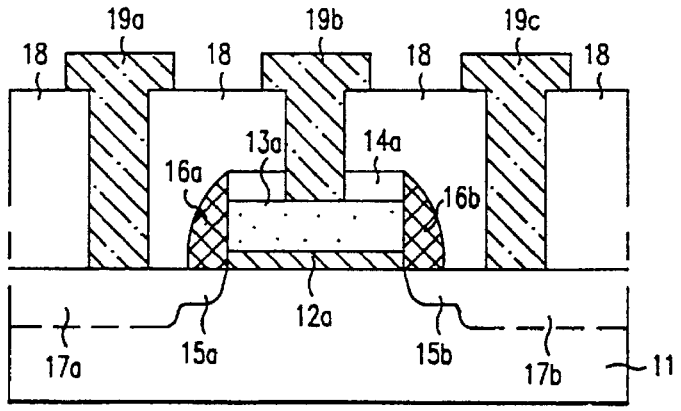
Figure 3A:
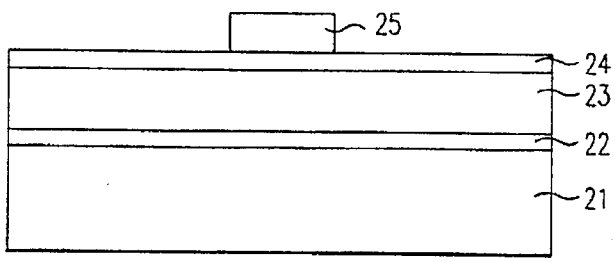
FIGS. 3a to 3f are cross-sectional views for illustrating a method of manufacturing an LDD MOSFET having a conventional inverse-T shaped structure.
Figure 3B:
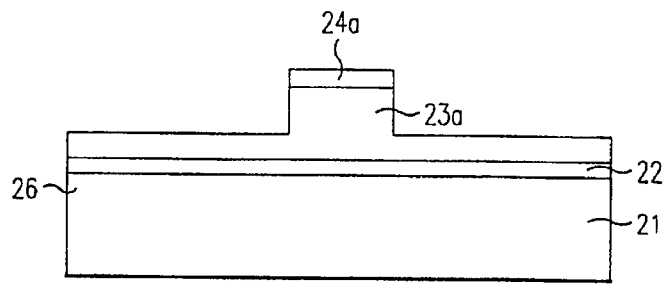
Figure 3C:
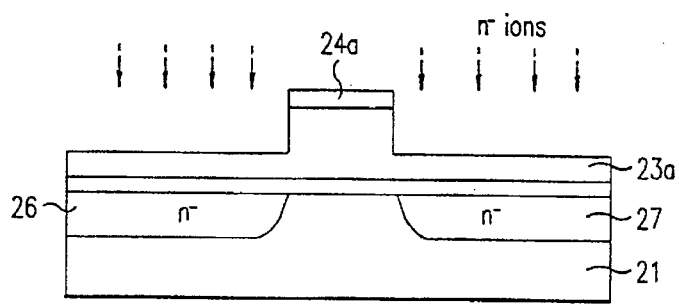
Figure 3D:
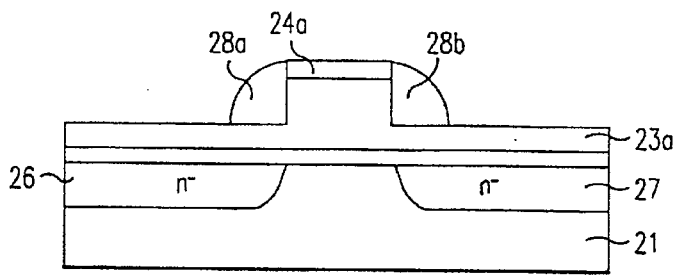
Figure 3E:
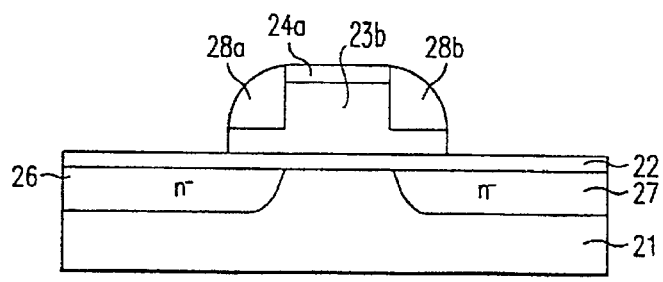
Figure 3F:
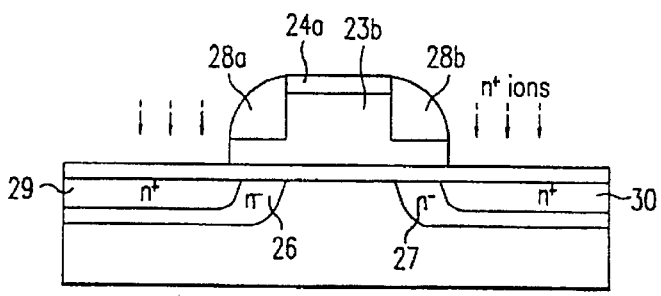
Figure 4A:
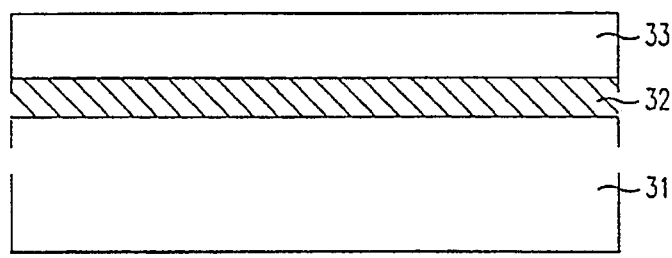
FIGS. 4a to 4h are cross-sectional views for illustrating an improved method of manufacturing an inverse-T shaped LDD MOSFET according to the present invention.

As shown in FIG. 4a, a p-type silicon substrate 31 is prepared as a semiconductor substrate of a first conductivity type. As those of ordinary skill in the art know, the substrate could alternately be prepared having the first conductivity type be n-type, in which case the dopants for the various steps will be of opposite type to those listed for FIGS. 4a to 4h. As a first insulating film, a thin silicon oxide film 32 is grown or deposited on p-type silicon substrate 31 using a thermal oxidation method or a CVD method, respectively.

Figure 4B:
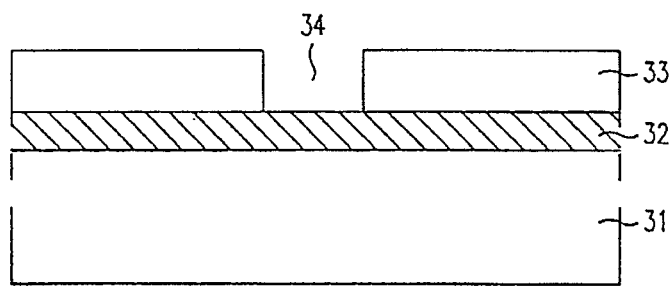

A photo-lithography process followed by an etching process is performed on silicon nitride film 33, thereby defining a first hole 34 having a predetermined width as shown in FIG. 4b.

Figure 4C:
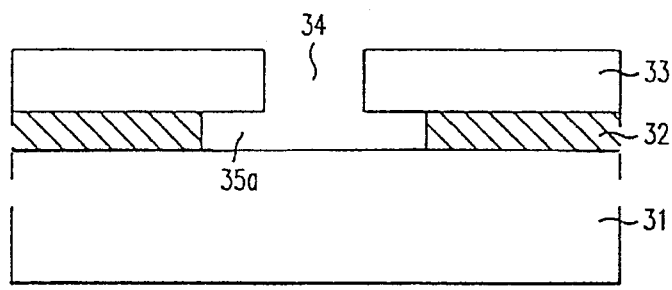
Figure 4D:
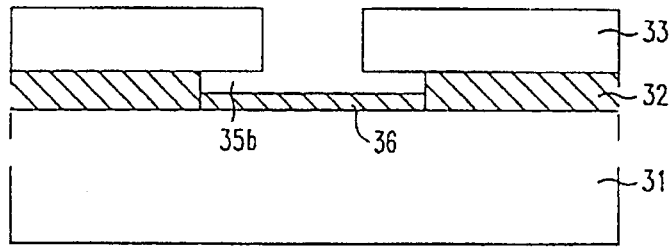

An isotropic wet-etching process is performed on the portions of silicon oxide film 32 exposed through the first hole 34, thereby forming a second hole 35a that is wider than first hole 34 and below it, as shown in FIG. 4c.

As the silicon nitride film 33 is not etched by the etch for the silicon oxide film 32, and vice versa, the times of etching while forming first hole 34 (which will be used to form a first gate region) and second hole 35a (which will be used to form a second gate region) are independent of each other.

On the surface of p-type silicon substrate 31 which has been exposed due to the formation of second hole 35a in thin silicon oxide film 32, a thermal oxidation process is performed. Thus, a silicon oxide film 36, to be used as a gate insulating film, is grown on the surface of p-type silicon substrate 31 within second hole 35a, to thereby define a void region 35b.

Figure 4E:
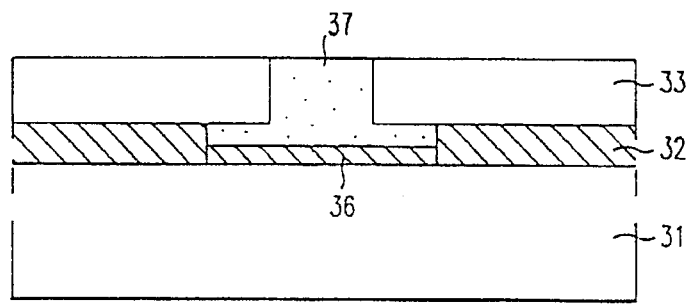

As shown in FIG. 4e, according to a CVD method, a conductor, e.g., an impurity-doped polysilicon is deposited so as to completely fill first hole 34 and void region 35b. Then, an etch-back process is performed through an anisotropic etching method, thereby removing the impurity-doped polysilicon left on the upper surface of silicon nitride film 33.

Stated differently, first hole 34 and void region 35b, together constituting an inverse-T shaped void region, are filled with impurity-doped polysilicon, thereby forming an inverse-T shaped gate electrode 37, as shown in FIG. 4e.

Figure 4F:
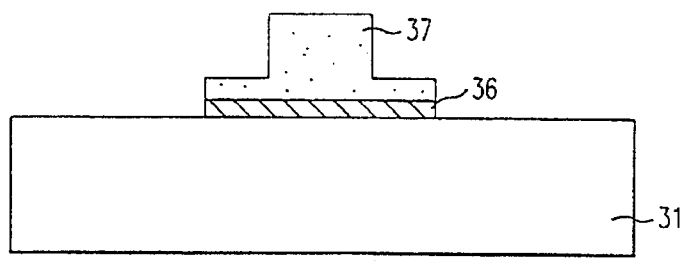

A dry-etching process or wet-etching process is then performed, thereby removing the remaining silicon nitride film 33. Then, a dry-etching process or wet-etching process is performed again, thereby removing thin silicon oxide film 32 and resulting in a structure as shown in FIG. 4f.

Figure 4G:
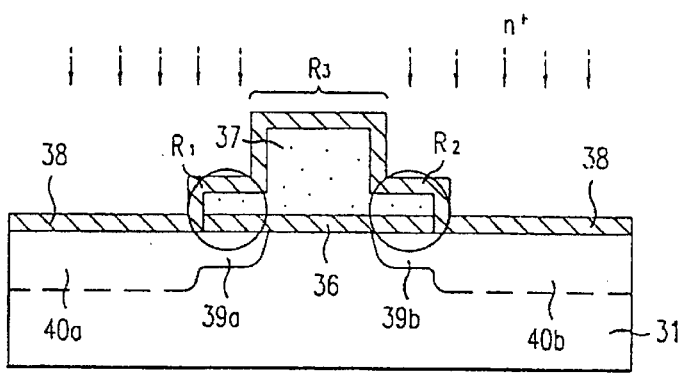

Using a thermal oxidation process or a CVD process, a thin silicon oxide film 38 for use as an ion-implantation buffer is formed on the entire exposed surface of inverse-T gate electrode 37 and p-type silicon substrate 31. Then, n-type impurity ions are implanted at a high impurity concentration over the entire surface of silicon oxide film 38, to thereby form low concentration source/drain regions 39a, 39b and, simultaneously, to form source/drain regions 40a, 40b of high impurity concentration, as shown in FIG. 4g.

That is, even if high concentration n-type ($n^+$) impurity ions are implanted over the entire surface of silicon oxide film 38, in p-type silicon substrate 31 corresponding to the bottom of both wings $R_1$ and $R_2$ of inverse-T shaped gate electrode 37, low concentration n-type ($n^-$ type) source/drain regions 39a and 39b are formed due to the thickness of silicon oxide film 36. In p-type silicon substrate 31 which is not covered with the inverse-T shaped gate electrode 36, the impurity ions are implanted directly through silicon oxide film 38, thereby forming high concentration n-type ($n^+$type) source/drain regions 40a and 40b.

Meanwhile, in a main body part excluding both wings $R_1$ and $R_2$ of inverse-T shaped gate electrode 37, $n^+$ type impurity ions do not reach the p-type silicon substrate 31 because the thickness of the main body part is too large. Therefore, no impurity region is formed below this portion of gate electrode 31.

As described above, according to FIG. 4f, only one ion-implantation of $n^+$ type impurity ions is performed, thereby forming LDD impurity regions, i.e., $n^-$ type source region 39a and $n^-$ type drain region 39b, as well as the high concentration impurity regions.

Thus, the LDD impurity regions, can be controlled electrically according to the gate voltage $V_G$. Therefore, the hot carrier effect which was generated in the drain interface of the conventional MOSFET can be prevented.

Further, since the gate voltage $V_G$ is applied in part via the wings of the inverse-T shaped gate electrode (under what would otherwise be the bottoms of sidewall spacers if a conventional MOSFET using conventional sidewall spacers were being used), the resistance of the LDD impurity regions is decreased. In addition, the current capacity of the MOSFET is increased due to the reduction of the resistance.

A silicon nitride film 41 having a planarized surface is formed on the entire surface of silicon oxide film 38 through a CVD method. A photo-lithography process is performed, thereby defining contact hole regions for interconnection on the upper surface of $n^+$ type source region 40a, inverse-T shaped gate electrode 37 and $n^+$ type drain region 40b, respectively.

Silicon oxide film 41 and silicon nitride film 38, corresponding to the respective defined contact holes, are removed to form source contact hole 42a, gate contact hole 42b and drain contact hole 42c.

Figure 4H:
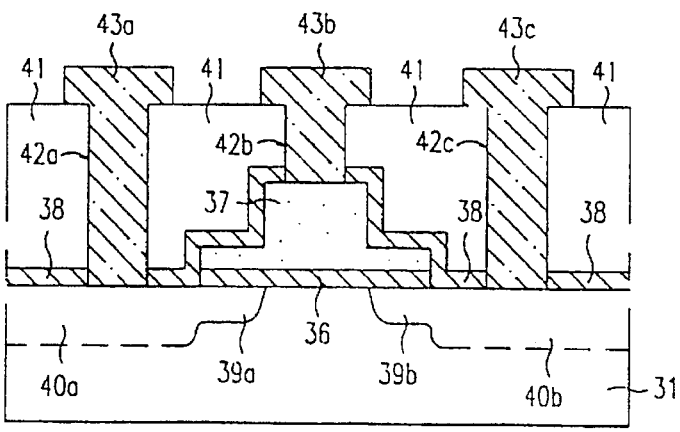

Then, a conductor or metal is deposited so as to completely fill the contact holes 42a, 42b and 42c. A photo-lithography process and an anisotropic dry-etching process are performed on the metal, and these are then fill with conductive material to thereby form source contact electrode 43a, gate contact electrode 43b and drain contact electrode 43c, as shown in FIG. 4h.

As described above, according to the improved method of manufacturing a transistor of the present invention, the following effects can be obtained.

First, the inverse-T shaped gate electrode can be formed easily without requiring an etch-stop endpoint.

Secondly, the LDD impurity regions and high concentration impurity regions can be formed simultaneously, according to one ion-implantation process.

What is claimed is:

1. A method of manufacturing an inverse-T shaped transistor, comprising the steps of:

forming a first insulating film on a semiconductor substrate of a first conductivity type;

forming a second insulating film on the first insulating film;

removing a portion of said second insulating film and a portion of said first insulating film to form a first hole in the second insulating film and a second hole in the first insulating film, with the second hole in the first insulating film being larger than the first hole in the second insulating film;

forming an insulating layer, within the second hole in the first insulating film, on the semiconductor substrate so as to diminish in size and yet retain the second hole in the first insulating film;

filling the hole in the second film and the void region in the first film with a conductor, to thereby form an inverse-T shaped gate electrode having wings extending from a central body portion of said inverse-T shaped gate electrode;

removing the first and the second insulating films;

forming a third insulating film, for use as an ion-implantation buffer, on the substrate and the inverse-T shaped gate electrode; and implanting impurity ions of a second conductivity type opposite to said first conductivity type into said substrate to thereby form lower concentration impurity regions in said substrate below both said wings of said gate electrode and to thereby form higher concentration, relative to said lower concentration, impurity regions in portions of said substrate which are not covered by said gate electrode.

2. The method as claimed in claim 1, wherein the step of forming said third insulating film for use as an ion-implantation buffer employs thermal oxidation.

3. The method as claimed in claim 1, wherein said conductor is an impurity-doped polysilicon.

4. The method as claimed in claim 1, wherein the step of removing a portion of said second insulating film and a portion of said first insulating film comprises the steps of:

performing a photo-lithography process and then an etching process on said second insulating film to remove a portion of said second insulating film, thereby forming the first hole; and removing a portion of said first insulating film through said first hole, to form the second hole.

5. The method as claimed in claim 4, wherein the step of removing a portion of said first insulating film is performed by isotropic wet-etching.

6. The method as claimed in claim 1, wherein said first insulating film is a silicon oxide film, and said second insulating film is a silicon nitride film having a different etch selectivity from that of said silicon oxide film.

7. The method as claimed in claim 1 wherein, after forming said lower concentration impurity regions and said higher concentration impurity regions, there are the additional steps of:

forming a fourth insulating film having a planarized surface on said third insulating film;

performing a photo-lithography process on said fourth insulating film and then an etching process on said fourth insulating film and said third insulating film, to thereby form contact holes for interconnection to said higher concentration impurity regions and to said inverse-T shaped gate electrode; and filling said contact holes with said conductor, to thereby form contact electrodes for said interconnection.

8. A method of manufacturing an inverse-T shaped transistor, comprising the steps of:

forming a first insulating film on a substrate of a first conductivity type;

forming a second insulating film on said first insulating film;

forming an inverse-T shaped void region by etching said first and second insulating films;

forming a gate electrode, having wings wider than a main body part of said gate electrode, by filling said inverse-T shaped void region with a conductor;

removing said first and second insulating films; and forming lower concentration impurity regions in substrate areas below the wings of said gate electrode, and higher concentration, relative to said lower concentration, impurity regions in substrate areas not covered by said gate electrode by implanting impurity ions of a second conductivity type opposite to said first conductive type.

9. The method of manufacturing an inverse-T shaped transistor as claimed in claim 8, and further comprising the step of forming a third insulating film for use as an ion-implantation buffer on the substrate and said gate electrode, prior to the implantation of said second conductivity type impurity ions.

10. The method of manufacturing an inverse-T shaped transistor as claimed in claim 9, wherein said third insulating film for use as an ion-implantation buffer is grown through a thermal oxidation method.

11. The method of manufacturing an inverse-T shaped transistor as claimed in claim 8, wherein said conductor is an impurity-doped polysilicon.

12. The method of manufacturing an inverse-T shaped transistor as claimed in claim 8, wherein said step of forming an inverse-T shaped void region comprises the steps of:

performing a photolithography process and then etching process on said second insulating film to remove a portion of said second insulating film, thereby forming a first hole; and removing a portion of said first insulating film through said first hole, to thereby form a second hole wider than said first hole.

13. The method of manufacturing an inverse-T shaped transistor as claimed in claim 12, wherein the step of removing a portion of said first insulating film is an isotropic wet-etching process.

14. The method of manufacturing an inverse-T shaped transistor as claimed in claim 8, wherein said first insulating film is a silicon oxide film, and said second insulating film is a silicon nitride film having a different etch selectivity from that of said silicon oxide film.

15. The method of manufacturing an inverse-T shaped transistor as claimed in claim 8 wherein, after forming said inverse-T shaped void region, a third insulating film is formed in said inverse-T shaded void region.

16. The method of manufacturing an inverse-T shaped transistor as claimed in claim 15, wherein said third insulating film is grown by thermal oxidation.

17. The method of manufacturing an inverse-T shaped transistor as claimed in claim 9, and further comprising, after forming said lower concentration impurity regions and higher concentration impurity regions, the steps of:

forming a fourth insulating film having a planarized surface on said third insulating film;

performing a photo-lithography process on said fourth insulating film and then an etching process on said fourth insulating film and said third insulating film, to thereby form contact holes through the said higher concentration impurity regions and said inverse-T shaped gate electrode; and filling said contact holes with a conductor, to thereby form contact electrodes.

* * * * *